(12) United States Patent
Shiomichi et al.

(10) Patent No.: US 11,823,987 B2
(45) Date of Patent: Nov. 21, 2023

(54) CIRCUIT BOARD AND SEMICONDUCTOR APPARATUS

(71) Applicant: CANON KABUSHIKI KAISHA, Tokyo (JP)

(72) Inventors: Hirotaka Shiomichi, Yokohama (JP); Satoshi Akiyama, Yokohama (JP); Atsunobu Mori, Suntou-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/013,958

(22) Filed: Sep. 8, 2020

(65) Prior Publication Data

US 2021/0082796 A1    Mar. 18, 2021

(30) Foreign Application Priority Data

Sep. 12, 2019 (JP) .................... 2019-166638

(51) Int. Cl.
*H01L 23/64* (2006.01)
*H01L 23/498* (2006.01)
*H01L 23/00* (2006.01)

(52) U.S. Cl.
CPC ........ *H01L 23/49811* (2013.01); *H01L 23/64* (2013.01); *H01L 24/48* (2013.01); *H01L 2224/48227* (2013.01)

(58) Field of Classification Search
CPC ......... H01L 23/64; H01L 24/48; H01L 24/49; H01L 23/49838
See application file for complete search history.

(56) References Cited

U.S. PATENT DOCUMENTS

| 6,538,336 | B1 | 3/2003 | Secker |
| 7,608,922 | B2 | 10/2009 | Danno |
| 7,982,301 | B2 | 7/2011 | Danno |
| 8,115,295 | B2 | 2/2012 | Danno |
| 8,471,379 | B2 | 6/2013 | Danno |
| 8,581,361 | B2 | 11/2013 | Ogura |

(Continued)

FOREIGN PATENT DOCUMENTS

| CN | 102569253 A | 7/2012 |
| CN | 104604345 A | 5/2015 |

(Continued)

OTHER PUBLICATIONS

United Kingdom Search Report dated Jun. 10, 2021 in corresponding British Application No. 2014078.6.

(Continued)

*Primary Examiner* — Michele Fan
(74) *Attorney, Agent, or Firm* — VENABLE LLP (57) ABSTRACT

The circuit board includes a plurality of bonding pads having a first bonding pad and a second bonding pad configured to supply a ground potential; a first ground wiring connected to the first bonding pad; a second ground wiring connected to the second bonding pad; and a first extension pad connected to the first ground wiring and a second extension pad connected to the second ground wiring, the first extension pad and the and second extension pad being provided in a different area from an area in which the plurality of bonding pads is provided, the first extension pad and the and second extension pad being connectable through a wire.

18 Claims, 10 Drawing Sheets

(56) References Cited

U.S. PATENT DOCUMENTS

| | | |
|---|---|---|
| 9,549,461 B2 | 1/2017 | Toyama |
| 9,673,142 B2 | 6/2017 | Sakata |
| 9,848,488 B1 * | 12/2017 | Moncayo .............. H05K 1/114 |
| 10,187,971 B2 | 1/2019 | Hareyama |
| 10,220,636 B2 | 3/2019 | Endo et al. .............. B41J 2/447 |
| 10,483,922 B2 | 11/2019 | Shibata et al. ...... H03F 3/45475 |
| 2002/0153618 A1 * | 10/2002 | Hirano ............. H01L 23/49838 257/784 |
| 2005/0184403 A1 | 8/2005 | Inagawa |
| 2005/0263881 A1 | 12/2005 | Danno |
| 2008/0237848 A1 | 10/2008 | Yoshikawa |
| 2010/0001393 A1 | 1/2010 | Danno |
| 2010/0289141 A1 | 11/2010 | Takeda |
| 2011/0121443 A1 | 5/2011 | Danno |
| 2012/0126900 A1 | 5/2012 | Danno |
| 2014/0240033 A1 * | 8/2014 | Rathi ................. H01L 23/5252 327/525 |
| 2020/0328172 A1 * | 10/2020 | Lu .......................... H01L 24/05 |

FOREIGN PATENT DOCUMENTS

| | | | |
|---|---|---|---|
| CN | 104851862 A | 8/2015 | |
| CN | 106486428 A | 3/2017 | |
| EP | 0805356 A2 * | 11/1997 | ............ H01L 24/05 |
| JP | 2005-340741 A | 12/2005 | |

OTHER PUBLICATIONS

Chinese Search Report dated Sep. 23, 2023 in corresponding Chinese Application No. 202010951182.6 (No translation available. Being provided as source of citation in foreign counterpart application.).

* cited by examiner

CIRCUIT BOARD AND SEMICONDUCTOR APPARATUS

BACKGROUND OF THE INVENTION

Field of the Invention

The present invention relates to a circuit board on which a circuit is mounted, and a semiconductor apparatus in which the circuit board is mounted.

Description of the Related Art

A semiconductor apparatus is an apparatus in which a semiconductor chip constituted by a plurality of circuit blocks such as analog circuits or digital circuits is mounted on a wiring substrate (also referred to as a "circuit board" or a "printed circuit board") and is integrated into a single package. In order to reduce electromagnetic interference (EMI) emanating from a semiconductor apparatus, various countermeasures such as described in the following are being studied with respect to semiconductor apparatuses. For example, studies are being conducted with respect to a countermeasure for suppressing EMI noise by inserting a capacitor between power supply wiring that supplies a power supply voltage and ground wiring that supplies a ground potential inside the package of a semiconductor apparatus. Further, studies are also being conducted with respect to a countermeasure in which terminals are provided in a state in which the power supply wiring and the ground wiring are separated for each circuit block so that the terminals do not have common impedance.

For example, in Japanese Patent Application Laid-Open No. 2005-340741, a semiconductor apparatus is disclosed in which terminals that individually supply the ground potential for a plurality of circuit blocks, respectively, from outside the package of the semiconductor apparatus are provided, in which the power supply wiring and the ground wiring are separated. By this means, a configuration can be provided in which, while having a common ground potential, the respective circuit blocks of the semiconductor apparatus do not have a common impedance. As a result, noise generated from a specific circuit block can be prevented from traveling around to another circuit block, and a reduction in EMI can be achieved.

In a semiconductor apparatus in which the power supply wiring and the ground wiring are separated, although a structure in which the individual circuit blocks do not have a common impedance can be obtained, on the other hand the individual impedance of the respective circuit blocks may increase in some cases. There is thus the problem that the electromagnetic susceptibility (EMS) decreases due to an increase in the individual impedance of the respective circuit blocks. Further, in the mounting substrate on which the semiconductor apparatus is mounted, the wiring efficiency with respect to the power supply wiring and the ground wiring in the mounting substrate decreases, because the number of terminals increases due to separating the power supply wiring and the ground wiring in the semiconductor apparatus. As a result, in some cases, the individual impedance at a certain circuit block may become large.

For example, by increasing the number of layers of a mounting substrate, the wiring efficiency of the power supply wiring and the ground wiring can be improved and the individual impedance in the mounting substrate can be decreased. However, there is the problem that the substrate cost will rise if the number of layers of the mounting substrate is increased. Further, in the wiring substrate within the semiconductor apparatus, by intentionally arranging the ground wiring so as to have a common impedance, the individual impedance of the semiconductor apparatus overall can be reduced and EMS can be improved. However, whenever a mounting substrate on which a semiconductor apparatus is to be mounted is changed, it is necessary to revise the ground wiring within the semiconductor apparatus, and there is thus the problem that costs are incurred in revising the wiring of the wiring substrate of the semiconductor apparatus.

SUMMARY OF THE INVENTION

An aspect of the present invention is a circuit board on which a semiconductor chip is mounted, the semiconductor chip having a plurality of circuits and a plurality of electrode pads connected to the plurality of circuits, the circuit board including a plurality of bonding pads electrically connected through wires with the plurality of electrode pads, the plurality of bonding pads including a first bonding pad and a second bonding pad configured to supply a ground potential, wherein the circuit board includes a first ground wiring connected to the first bonding pad, a second ground wiring connected to the second bonding pad, and a first extension pad connected to the first ground wiring and a second extension pad connected to the second ground wiring, the first extension pad and the and second extension pad being provided in a different area from an area in which the plurality of bonding pads is provided, the first extension pad and the second extension pad being connectable through a wire.

Another aspect of the present invention is a semiconductor apparatus including a circuit board on which a semiconductor chip is mounted, the semiconductor chip having a plurality of circuits and a plurality of electrode pads connected to the plurality of circuits, the circuit board including a plurality of bonding pads electrically connected through wires with the plurality of electrode pads, the plurality of bonding pads including a first bonding pad and a second bonding pad configured to supply a ground potential, wherein the circuit board includes a first ground wiring connected to the first bonding pad, a second ground wiring connected to the second bonding pad, and a first extension pad connected to the first ground wiring and a second extension pad connected to the second ground wiring, the first extension pad and the and second extension pad being provided in a different area from an area in which the plurality of bonding pads is provided, the first extension pad and the second extension pad being connectable through a wire, wherein the semiconductor apparatus further comprises ball electrodes on a surface of the circuit board which is opposite to a surface on which the semiconductor chip is mounted, the ball electrodes electrically connected to the plurality of the bonding pads, and wherein the circuit board and the semiconductor chip mounted on the circuit board are sealed by a seal member.

Further features of the present invention will become apparent from the following description of exemplary embodiments with reference to the attached drawings.

DESCRIPTION OF THE EMBODIMENTS

Embodiment 1

[Structure of Semiconductor Apparatus]

Figure 1:
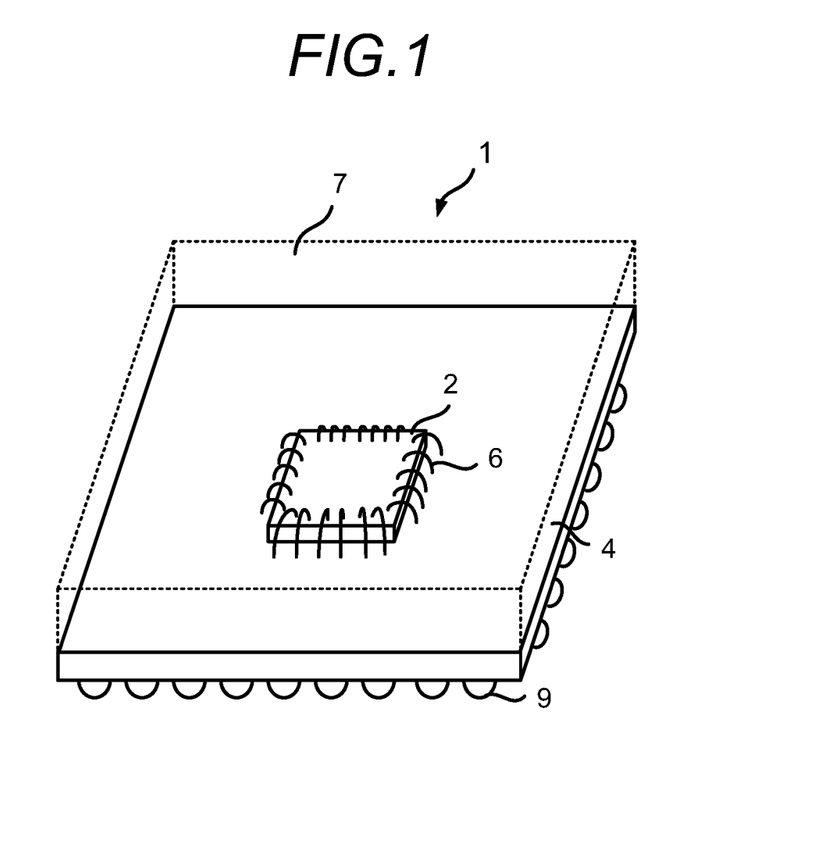
FIG. 1 is a perspective view illustrating the structure of a semiconductor apparatus of Embodiments 1 and 2.

FIG. 1 is a perspective view illustrating an example of the structure of a semiconductor apparatus 1 of Embodiment 1. As illustrated in FIG. 1, in the semiconductor apparatus 1, a semiconductor chip 2 constituted by a plurality of circuit blocks (not illustrated) is mounted on a wiring substrate 4, and the semiconductor chip 2 and the wiring substrate 4 are connected through electrically conductive bonding wires 6. Note that, the wiring substrate 4 is also referred to as a "circuit board" or a "printed circuit board". In the semiconductor apparatus 1, as illustrated in FIG. 1, the semiconductor chip 2 and the plurality of bonding wires 6 is covered and sealed by a seal member 7 (indicated by a dotted line in the drawing) that is formed of a sealing resin. Further, the semiconductor apparatus 1 illustrated in FIG. 1 is a BGA (ball grid array)-type semiconductor package in which ball electrodes 9 that are external terminals are provided in an array on the opposite side to the side on which the semiconductor chip 2 is mounted of the wiring substrate 4.

[Wiring Substrate and Semiconductor Chip]

Figure 2:
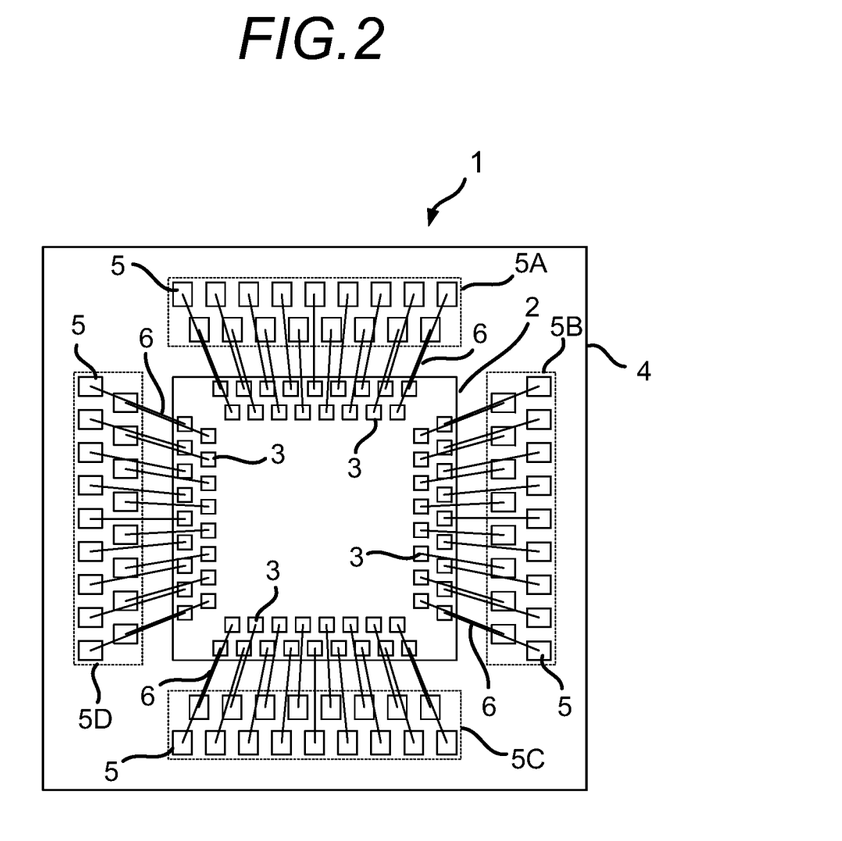
FIG. 2 is a schematic plan view illustrating the structure of the semiconductor apparatus of Embodiments 1 and 2.

FIG. 2 is a schematic plan view illustrating one example of the structure of the semiconductor apparatus 1 of the present embodiment, and is a top view of the semiconductor apparatus 1 illustrated in FIG. 1 as seen from above the wiring substrate 4. As illustrated in FIG. 2, the semiconductor chip 2 is mounted at the center of the wiring substrate 4. The semiconductor chip 2 is, for example, constituted by a plurality of circuit blocks, described later, formed on a chip using silicon, and a plurality of electrode pads 3 is provided at each side at the peripheral portion of the semiconductor chip 2. The electrode pads 3 are power supply terminals for a power supply voltage, a ground potential or the like that is supplied to the circuit blocks inside the semiconductor chip 2, or signal terminals for signals input to the circuit blocks or signals output from the circuit blocks.

On the other hand, as described later, the wiring substrate 4 is a substrate in which, for example, wiring patterns are formed using copper foil on a resin substrate. The wiring substrate 4 has bonding pad areas 5A, 5B, 5C and 5D constituted by a plurality of bonding pads 5 that face the electrode pads 3 provided at each side of the semiconductor chip 2. The respective bonding pads 5 of the bonding pad areas 5A, 5B, 5C and 5D are electrically connected in a one-to-one manner to the corresponding electrode pads 3 provided on the semiconductor chip 2, through the bonding wires 6. The respective bonding pads 5 are electrically connected through vias (see FIG. 4), which are described later, to the ball electrodes 9 provided on the rear side of the wiring substrate 4, and the exchange of signals with outside through the ball electrodes 9 and the supply of a power supply voltage and the like are performed using the semiconductor chip 2.

[Configuration of Semiconductor Chip]

Figure 3:
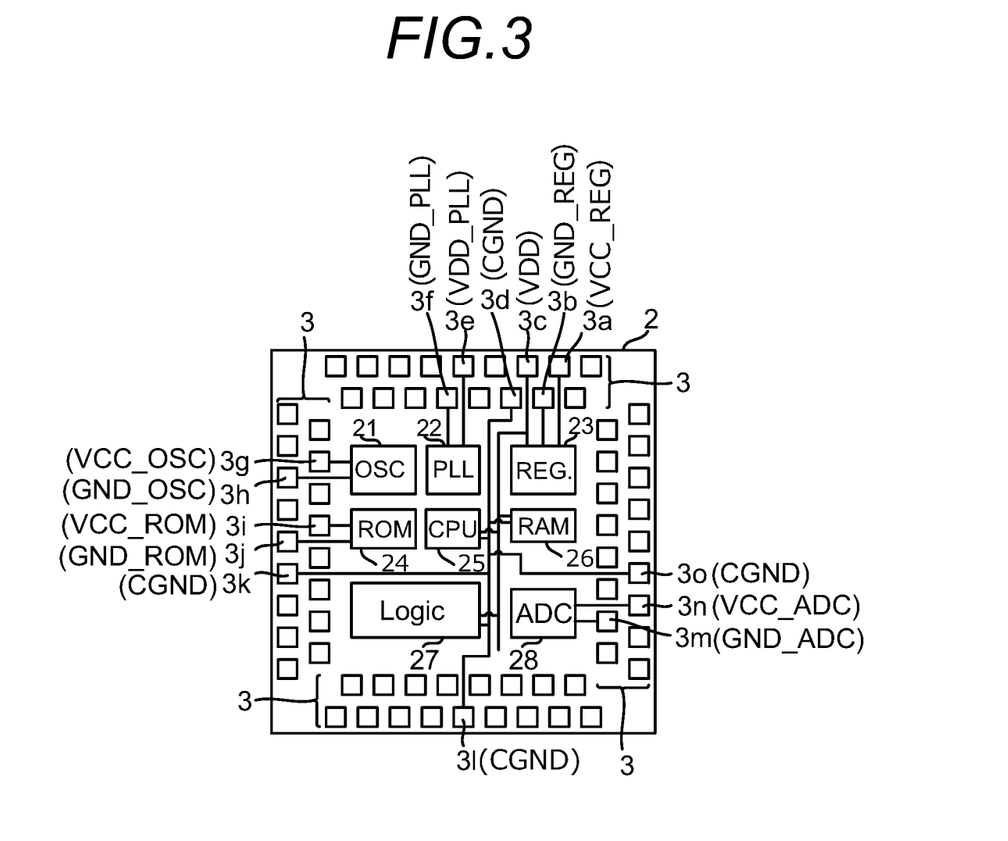
FIG. 3 is a block diagram illustrating the configuration of a semiconductor chip of Embodiments 1 and 2.

FIG. 3 is a block diagram illustrating one example of the configuration of the semiconductor chip 2. The semiconductor chip 2 has circuit blocks that include an oscillation circuit (OSC) 21, a phased locked loop (PLL) 22, a linear regulator circuit (REG) 23, a nonvolatile memory (ROM) 24, a processor (CPU) 25, a volatile memory (RAM) 26, a Logic 27 and an analog/digital conversion circuit (ADC) 28, and also has a plurality of electrode pads 3 connected to the respective circuit blocks at the four sides of the peripheral portion thereof.

The OSC 21 is an oscillation circuit that generates a reference clock signal from an input signal that is input from an external crystal resonator (not illustrated). The circuit block of the OSC 21 is connected to an electrode pad $3g$ (VCC_OSC) that supplies a power supply voltage, and an electrode pad $3h$ (GND_OSC) that supplies a ground potential (hereinafter, also referred to as "GND potential"). The PLL 22 is a PLL (phased locked loop) circuit that multiplies the frequency of the reference clock signal generated by the OSC 21. The circuit block of the PLL 22 is connected to an electrode pad $3e$ (VDD_PLL) that supplies a power supply voltage, and an electrode pad $3f$ (GND_PLL) that supplies a GND potential. Because the OSC 21 and the PLL 22 are circuits that generate a clock signal, in some cases, oscillation noise is generated due to repeated voltage fluctuations of a clock signal. The oscillation noise travels around to other circuit blocks or signal terminals through common impedance between circuit blocks, and imparts an influence such as raising the level of radiation noise that is a cause of EMI (electromagnetic interference). Therefore, in the present embodiment, in order to reduce EMI, a configuration is adopted in which the power supply wiring that supplies the power supply voltage and the ground wiring (hereinafter, referred to as "GND wiring") that supplies the GND potential are separated, so as to be free of common impedance.

The REG 23 is a linear regulator circuit that generates a power supply voltage which is used inside the semiconductor chip 2 from a power supply voltage supplied by an external power supply device. The REG 23 is connected to an electrode pad $3a$ (VCC_REG) that supplies a power supply voltage from an external power supply device, an electrode pad $3b$ (GND_REG) that supplies a GND potential, and an electrode pad $3c$ (VDD) for outputting a power supply voltage generated inside the REG 23. The ROM 24 is a nonvolatile memory that stores a control program of the CPU 25, and is connected to an electrode pad $3i$ (VCC_ROM) that supplies a power supply voltage, and an electrode pad $3j$ (GND_ROM) that supplies a GND potential. The CPU 25 reads out the control program stored in the ROM 24 and executes arithmetic processing. The RAM 26 is a volatile memory, and stores data that is temporarily saved such as interim results obtained during arithmetic processing by the CPU 25.

The Logic 27 is, for example, a hardware circuit such as a communication circuit or a timer circuit, and operates in accordance with instructions from the CPU 25. The ADC 28 is an analog/digital conversion circuit configured to convert an analog signal voltage input from an external terminal to a digital code, and is connected to an electrode pad $3n$ (VCC_ADC) that supplies a power supply voltage and an electrode pad 3m (GND_ADC) that supplies a GND potential. Note that, the CPU 25, the RAM 26 and the Logic 27 that are predetermined circuits are connected to the electrode pad 3c (VDD) from which a common power supply voltage is output, and to electrode pads 3d, 3k, 3l and 3o which supply a common GND potential (CGND). Note that, in the present embodiment, since the required power supply voltage differs depending on the circuit block, the power supply voltages are separated into a power supply voltage VDD and a power supply voltage VCC.

[Wiring Pattern of Wiring Substrate]

Figure 4:
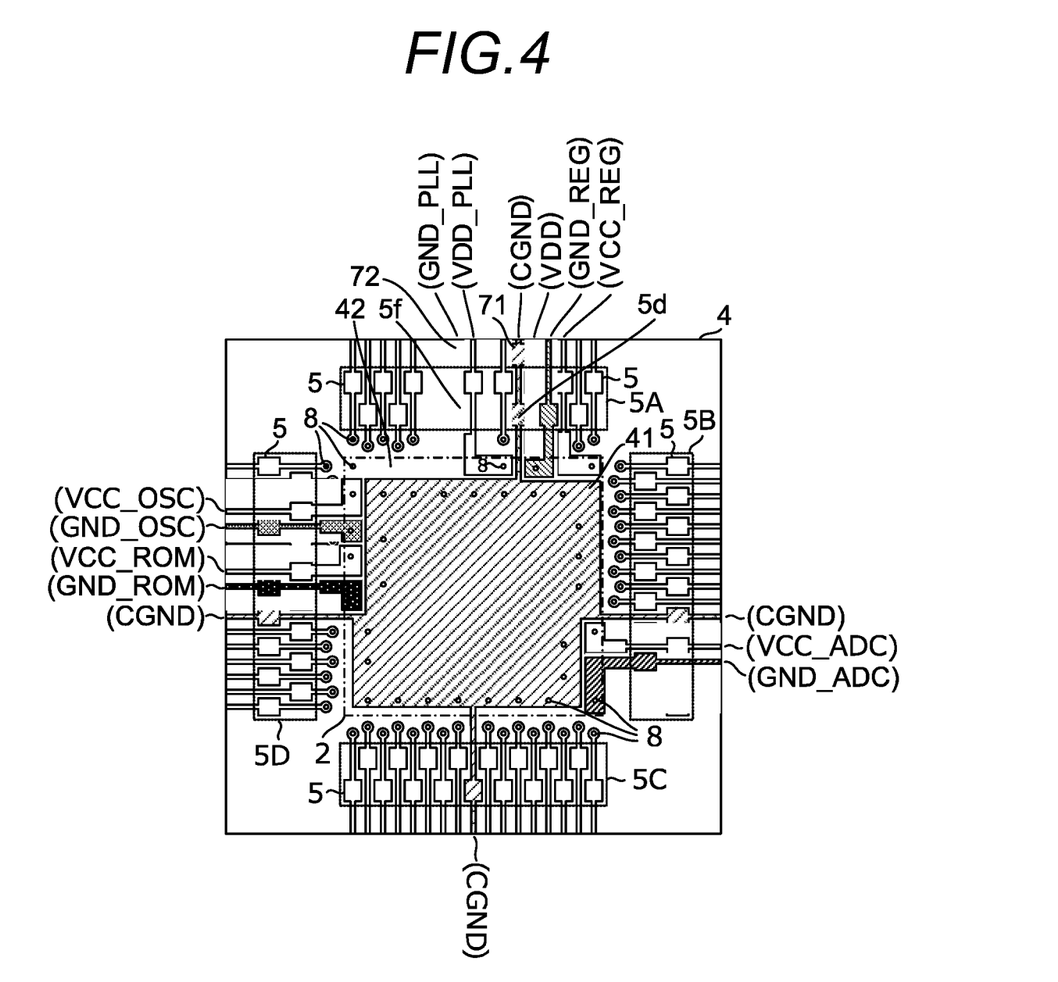
FIG. 4 is an outer layer wiring pattern diagram illustrating a wiring pattern of a wiring substrate of Embodiment 1.

FIG. 4 is an outer layer wiring pattern diagram illustrating one example of the wiring pattern of the wiring substrate 4. The outer layer wiring pattern illustrated in FIG. 4 is a wiring pattern that is provided on the face of the wiring substrate 4 on which the semiconductor chip 2 is mounted, and an area surrounded by an alternate long and short dash line in FIG. 4 indicates the position (place) at which the semiconductor chip 2 is mounted. The bonding pad areas 5A, 5B, 5C and 5D each surrounded by a dotted line are provided at the four sides at the periphery of the wiring substrate 4, and 17 bonding pads 5 provided in two rows are provided in each bonding pad area. In FIG. 4, among the wiring patterns of the bonding pads provided in each bonding pad area, the GND wirings (for example, GND_PLL and CGND) which supply a ground potential are indicated by cross-hatching. In FIG. 4, bonding pads 5 other than the bonding pads 5 for the GND wirings are not cross-hatched, and are shown as outline bonding pads 5. The outline bonding pads 5 are connected to the electrode pads 3 of signal input/output terminals or terminals supplying a power supply voltage of the semiconductor chip 2 in FIG. 3, and one end of the wiring pattern is connected to a via 8. The respective vias 8 are electrically connected to the ball electrodes 9 (see FIG. 1) provided on the rear side of the wiring substrate 4. Further, the other end of the wiring patterns connected to all of the bonding pads 5 including the bonding pads 5 of the GND wirings extends to the edge of the outer peripheral portion of the wiring substrate 4.

The respective circular marks inside the wiring patterns of the bonding pads 5 of the power supply wirings VDD_PLL, VDD, VCC_REG, VCC_ADC, VCC_OSC and VCC_ROM represent a via 8. Similarly, the respective circular marks inside the wiring patterns of the bonding pads 5 of the GND wirings GND_PLL, CGND, GND_REG, GND_ADC, GND_OSC and GND_ROM indicated by cross-hatching represent a via 8. Among the plurality of GND wirings, the GND wirings CGND provided at each side at the periphery of the wiring substrate 4 are connected to each other through a GND wiring 41 (first ground wiring) provided at the central part of the wiring substrate 4. Further, the GND wiring GND_PLL is connected to a GND wiring 42 (second ground wiring).

In FIG. 4, a bonding pad denoted by reference character 5d (first bonding pad) is a bonding pad of the GND wiring CGND (GND wiring 41). On the other hand, a bonding pad denoted by reference character 5f (second bonding pad) is a bonding pad of the GND wiring GND_PLL (GND wiring 42). Further, a bonding pad denoted by reference numeral 71 (first extension pad) is an extension bonding pad (hereinafter, referred to as "extension pad") of the GND wiring CGND. On the other hand, a bonding pad denoted by reference numeral 72 (second extension pad) is an extension pad of the GND wiring GND_PLL. As illustrated in FIG. 4, the extension pads 71 and 72 are provided between the bonding pad area 5A and the outer peripheral edge of the wiring substrate 4. The extension pads 71 and 72 are described later.

In FIG. 2, the bonding pads 5 of the power supply wirings and the GND wirings of the wiring substrate 4 are separated, and the respective bonding pads are connected with the electrode pads 3 of the semiconductor chip 2. In the wiring substrate 4 illustrated in FIG. 4 also, the electrode pads 3 (not illustrated in FIG. 4) of the semiconductor chip 2 are connected to the corresponding bonding pads 5. Therefore, in the wiring substrate 4 also, the power supply wirings and the GND wirings are provided separately from each other. As the number of separated power supply wirings and GND wirings increases in this manner, in a case where the mounting substrate on which the semiconductor apparatus 1 is mounted is a substrate having a low number of layers in which the number of layers is, for example, two, the wiring efficiency on the mounting substrate decreases. As a result, in some cases, the individual impedance of a certain power supply wiring or GND wiring becomes large.

[Connection Between Semiconductor Apparatus and Mounting Substrate]

Figure 5:
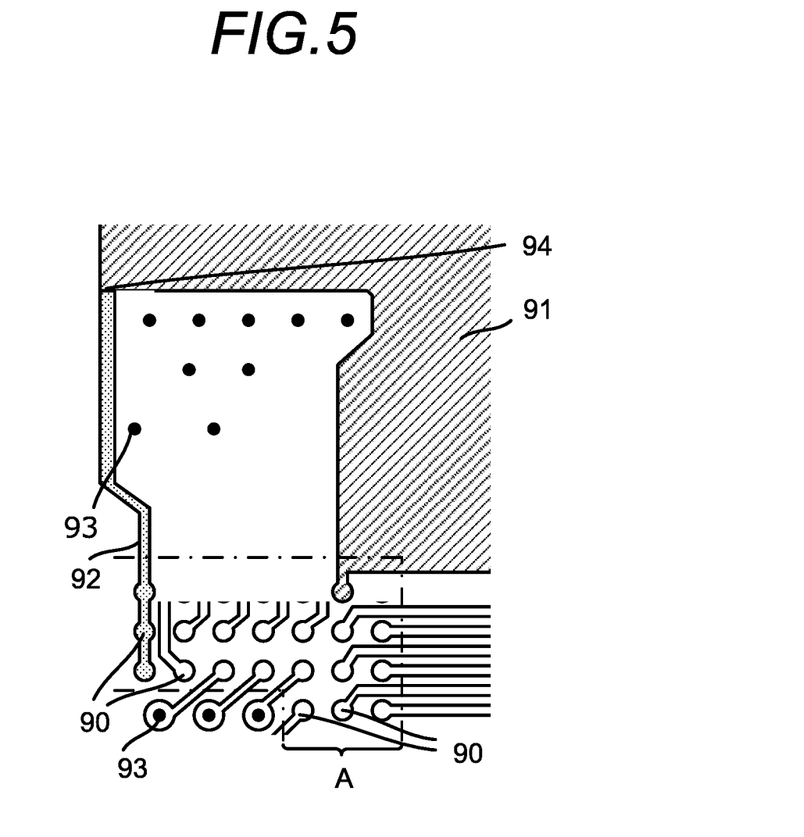
FIG. 5 is a wiring pattern diagram illustrating a wiring pattern of a mounting substrate of Embodiment 1.

FIG. 5 is a view illustrating one example of a wiring pattern of a mounting substrate on which the semiconductor apparatus 1 having the wiring substrate 4 illustrated in FIG. 4 is mounted, and which is electrically connected thereto through the ball electrodes 9 provided in the semiconductor apparatus 1. In FIG. 5, the semiconductor apparatus 1 is mounted so that the ball electrodes 9 are mounted on respective lands 90 having a circular shape disposed in an area A that is sandwiched by an alternate long and short dash line in FIG. 5 of the mounting substrate, and the lands 90 and the ball electrodes 9 are electrically connected. A GND wiring 91 illustrated in FIG. 5 is a GND wiring pattern of the mounting substrate, and is connected to the GND wiring 41 (see FIG. 4) of the wiring substrate 4 through the ball electrodes 9. Further, a GND wiring 92 is also a GND wiring pattern of the mounting substrate, and is connected to the GND wiring 42 (see FIG. 4) of the wiring substrate 4 through the ball electrodes 9. The other wiring patterns illustrated in FIG. 5 are signal wirings, with a circular land 90 provided at one end of each wiring pattern, and the other end connected to a through-hole 93. The GND wiring 91 and the GND wiring 92 are connected at a position 94 that is separated from the positions at which these signal wirings contact the ball electrodes 9 of the semiconductor apparatus 1.

For example, if the individual impedance of the GND wiring 42 becomes large relative to the GND wiring 41 of the wiring substrate 4, a malfunction of the semiconductor chip 2 is liable to occur due to EMS. That is, a malfunction such as deviations in the clock that the PLL 22 of the semiconductor chip 2 generates may be caused through the GND wiring 42 which has a large individual impedance, due to variations in the ground potential of the respective GND wirings occurring due to EMS. As the result of such a malfunction, inconsistencies will arise in the timings for circuit operations at the CPU 25 which operates based on a clock signal supplied from the PLL 22, and for example, the circuit operations may enter an error state such as a bus fault.

In the present embodiment, to avoid such a situation, the extension pad 71 that is connected to the GND wiring 41, and the extension pad 72 that is connected to the GND wiring 42 are provided on the wiring substrate 4, and are provided between the bonding pad area 5A and the peripheral edge of the wiring substrate 4. Further, in a case where the individual impedance of the GND wiring 42 is large relative to the GND wiring 41, the extension pad 71 and the extension pad 72 are electrically connected by a bonding wire 6. By this means, the individual impedance of the GND wiring 42 of the PLL 22 can be reduced, and a malfunction of the PLL 22 due to EMS can be prevented and the EMS characteristics can be improved. With respect to the positions at which the extension pad 71 and the extension pad 72 are provided on the wiring substrate 4, it is necessary to avoid interference between the bonding wire 6 that connects the extension pads 71 and 72 and the other bonding wires 6 connected to the bonding pads 5 of the bonding pad area 5A. That is, the two extension pads 71 and 72 are provided at positions such that the bonding wire 6 that links the extension pad 71 and the extension pad 72 does not interfere with the bonding wires 6 that link the bonding pad areas 5A, 5B, 5C and 5D with the semiconductor chip 2.

Note that, although in FIG. 4, only the extension pad 72 that is connected to the GND wiring 42, and the extension pad 71 that is connected to the GND wiring 41 of the bonding pad area 5A are provided, an extension pad that is connected to the GND wiring GND_REG may be added. In addition, although in FIG. 4, the extension pads are only provided in the bonding pad area 5A, extension pads may also be provided in correspondence with the GND wiring at the periphery of the wiring substrate 4. For example, with respect to the bonding pad area 5B, respective extension pads may be provided for the GND wiring GND_ADC and the GND wiring CGND that is connected to the GND wiring 41. Similarly, with respect to the bonding pad area 5D, respective extension pads may be provided for the GND wirings GND_OSC and GND_ROM, and the GND wiring CGND that is connected to the GND wiring 41. In addition, with respect to the bonding pad area 5C also, an extension pad may be provided for the GND wiring CGND that is connected to the GND wiring 41. Note that, in a case where extension pads are provided in the bonding pad areas 5B and 5D, it is desirable to provide the extension pads in the following areas. That is, to avoid interference between the bonding wires 6 that connect the extension pads, and other bonding wires 6, it is desirable to provide the extension pads in areas between the respective bonding pad areas 5B and 5D and the outer peripheral portion (peripheral edge side) of the wiring substrate 4.

By arranging extension pads capable of connecting the GND wirings using a bonding wire 6 on the wiring substrate 4 in the manner described above, it is possible to adjust the individual impedance and common impedance according to whether or not the extension pads 71 and 72 are connected to each other. By this means, with regard to the mounting substrate on which the semiconductor apparatus 1 is mounted, it is possible to select whether to prioritize decreasing EMI or to prioritize improving EMS characteristics, and the degree of freedom with respect to the wiring on the mounting substrate can be improved. In addition, as described above, in the present embodiment, impedance adjustment can be performed in accordance with whether it is necessary to connect the extension pads 71 and 72 by means of the bonding wire 6. Therefore, even in a case where the mounting substrate is changed, since it will not be necessary to revise the structure of the wiring substrate 4 of the semiconductor apparatus 1, production costs associated with revising the structure of the wiring substrate 4 can be eliminated.

Other Embodiments

In the present embodiment, the extension pads 71 and 72 provided in the bonding pad area 5A have been described. Although the extension pads 71 and 72 are provided between the bonding pad area 5A and the peripheral edge of the wiring substrate 4 because the shape of the bonding pad area 5A is rectangular, the positions of the extension pads 71 and 72 are not limited to the positions illustrated in FIG. 4.

Figure 6:
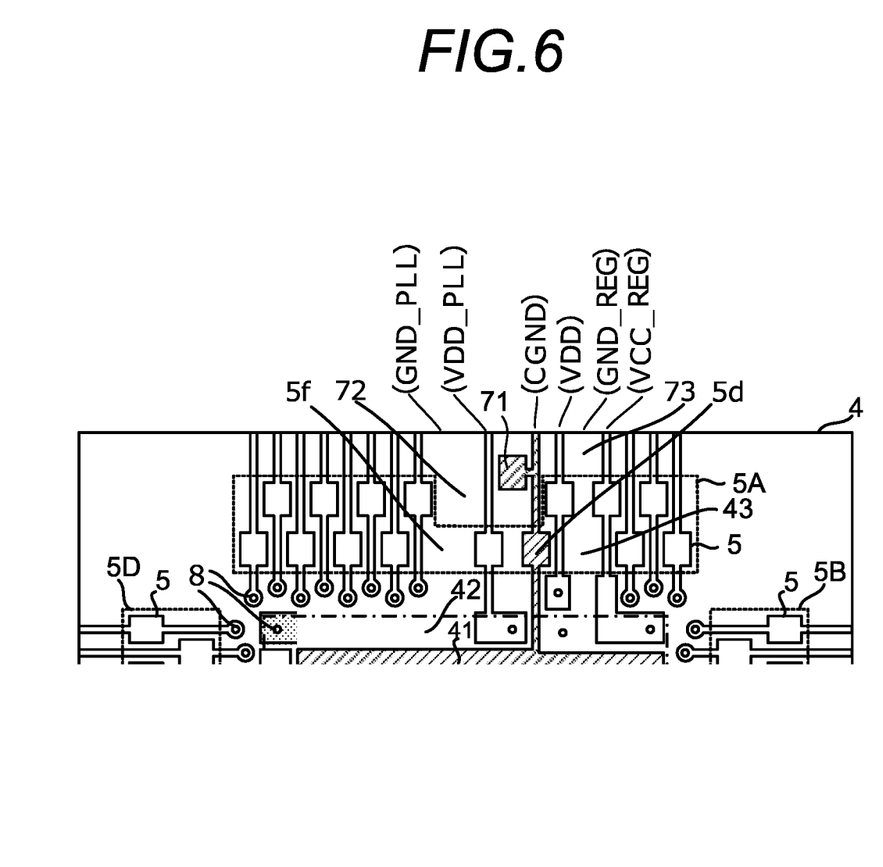
FIG. 6 is an outer layer wiring pattern diagram illustrating a wiring pattern of the wiring substrate of Embodiment 1.

FIG. 6 is a view for describing an example in which the extension pads 71 and 72 are provided in a depressed shape portion of the bonding pad area 5A. In the bonding pad area 5A illustrated in FIG. 6, the arrangement of the bonding pads 5 differs from the bonding pad area 5A illustrated in FIG. 4. Specifically, the wiring pattern illustrated in FIG. 6 does not include the two bonding pads 5 provided between the power supply wiring VDD_PLL and the GND wiring CGND (GND wiring 41) in the wiring pattern illustrated in FIG. 4. Therefore, the bonding pad area 5A illustrated in FIG. 6 has a depressed shape portion on the outer peripheral portion side of the wiring substrate 4 in the area in which the bonding pads 5 for the GND wiring GND_PLL, the power supply wiring VDD_PLL and the GND wiring CGND are provided, and the extension pads 71 and 72 are provided in the depressed shape portion. Further, in FIG. 6, an extension pad 73 that is connected to the GND wiring GND_REG that is the GND wiring 43 is provided between the bonding pad area 5A and the peripheral edge of the wiring substrate 4. For example, in a case where the individual impedance of the GND wiring 43 is large relative to the GND wiring 41 of the wiring substrate 4, the extension pad 71 and the extension pad 73 may be connected through the bonding wire 6.

Figure 7:
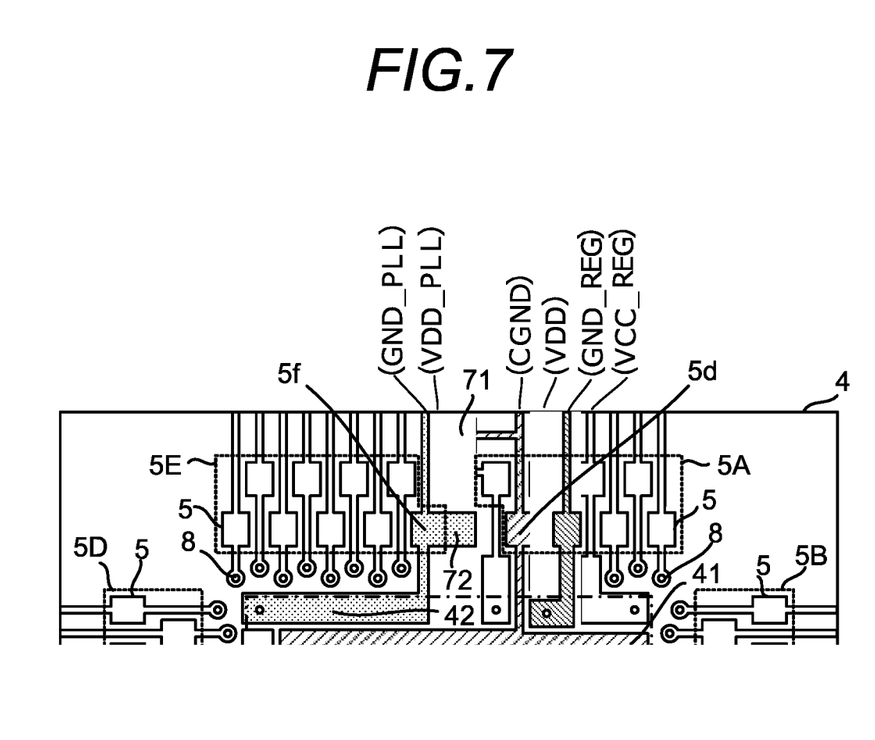
FIG. 7 is an outer layer wiring pattern diagram illustrating a wiring pattern of the wiring substrate of Embodiment 1.

Further, although FIG. 4 illustrates an example in which one bonding pad area among the bonding pad areas 5A, 5B, 5C and 5D is provided at each of the four sides of the semiconductor chip 2, the number of bonding pad areas that can be provided at each side of the wiring substrate 4 is not limited to one. FIG. 7 illustrates an example in which the bonding pad area 5A of the wiring substrate 4 illustrated in FIG. 6 is divided into two bonding pad areas 5A and 5E. In FIG. 7, the extension pad 71 that is connected to the GND wiring 41 belongs to the bonding pad area 5A, and is provided between the bonding pad area 5A and the peripheral edge of the wiring substrate 4. On the other hand, the extension pad 72 that is connected to the GND wiring 42 belongs to the bonding pad area 5E, and the area of the extension pad 72 is expanded so that the extension pad 72 also serves as a bonding pad 5f, and the extension pad 72 is provided between the bonding pad area 5A and the bonding pad area 5E. For example, in a case where the individual impedance of the GND wiring 42 is large relative to the GND wiring 41 of the wiring substrate 4, the extension pad 71 and the extension pad 72 may be connected through the bonding wire 6. At such time, because the bonding wire 6 that connects the extension pad 71 and the extension pad 72 passes through the area between the bonding pad area 5A and the bonding pad area 5E, the bonding wire 6 does not interfere with other bonding wires 6. Note that, the extension pad 73 illustrated in FIG. 6 is deleted from the example illustrated in FIG. 7.

As described above, according to the present embodiment, adjustment of impedance of a wiring substrate can be performed using an inexpensive configuration.

Embodiment 2

In Embodiment 1, an example was described in which extension pads connected to GND wirings are provided between bonding pad areas and the peripheral portion edge side of the wiring substrate. In Embodiment 2, to further increase the options with respect to impedance adjustment, an example will be described in which extension pads are provided between a semiconductor chip and bonding pad areas. Note that, the semiconductor apparatus 1 and the semiconductor chip 2 have the same configuration as in Embodiment 1, and the present embodiment is described using the same reference characters to denote the same components as in Embodiment 1, and a description of components as in Embodiment 1 is omitted here.

[Wiring Pattern of Wiring Substrate]

Figure 8:
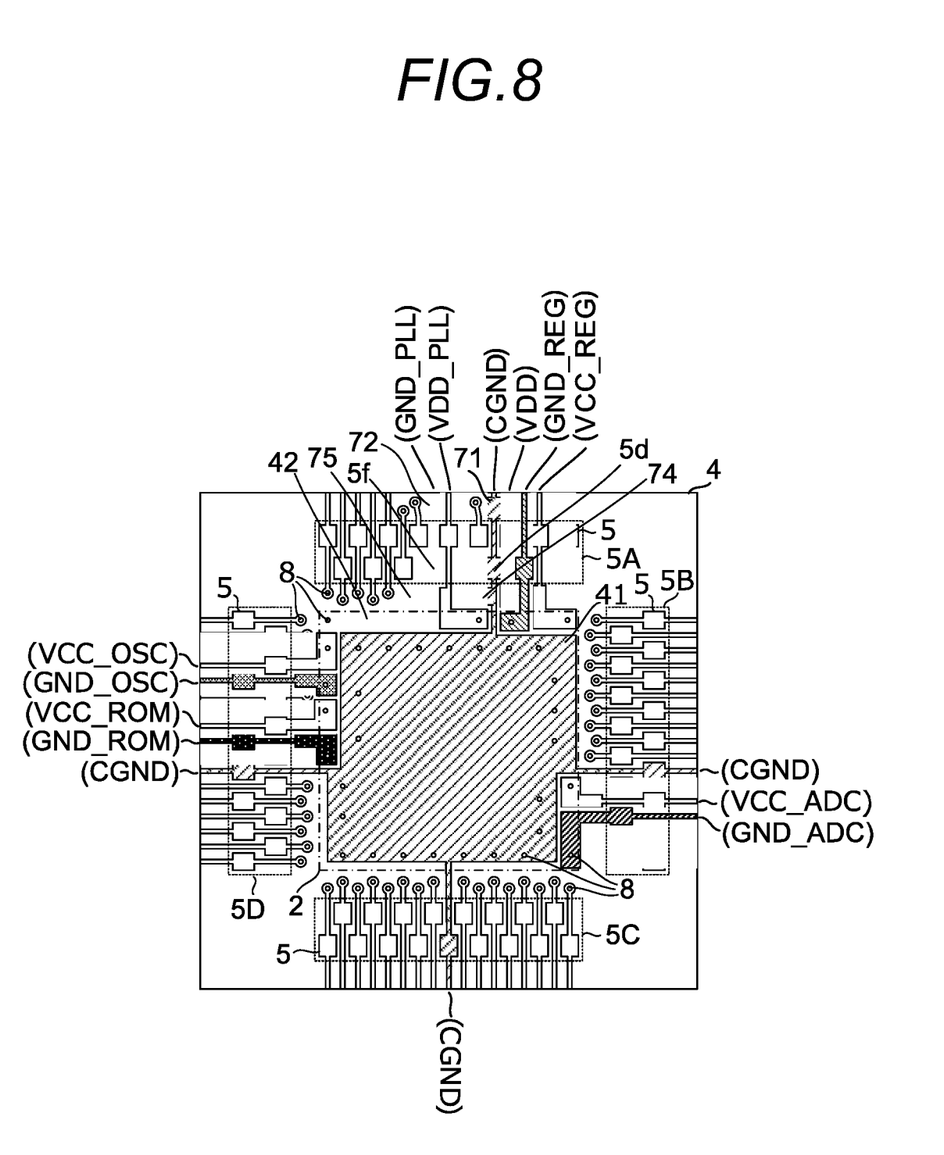
FIG. 8 is an outer layer wiring pattern diagram illustrating a wiring pattern of a wiring substrate of Embodiment 2.

FIG. 8 is an outer layer wiring pattern diagram illustrating one example of a wiring pattern of the wiring substrate 4 of the present embodiment. The outer layer wiring pattern diagram illustrated in FIG. 8 differs from FIG. 4 of Embodiment 1 in the respect that an extension pad 74 that is connected to the GND wiring 41, and an extension pad 75 that is connected to the GND wiring 42 are provided on the wiring substrate 4. Although the extension pads 71 and 72 described in Embodiment 1 are provided between the bonding pad area 5A and the peripheral portion edge side of the wiring substrate 4, the extension pads 74 and 75 are provided between the bonding pad area 5A and the semiconductor chip 2. Note that, in FIG. 8, in order to provide the extension pad 74, the position of the via of the wiring pattern on the left side of the GND wiring 41 in the drawing is changed from between the bonding pad area 5A and the semiconductor chip 2 (FIG. 4) to between the bonding pad area 5A and the peripheral portion edge side of the wiring substrate 4. Likewise, in order to provide the extension pad 75, the positions of the vias of the two wiring patterns on the left side of the GND wiring 42 in the drawing are changed from between the bonding pad area 5A and the semiconductor chip 2 (FIG. 4) to between the bonding pad area 5A and the peripheral portion edge side of the wiring substrate 4. The other wiring patterns of the wiring substrate 4 illustrated in FIG. 8 are the same as in FIG. 4 of Embodiment 1, and hence a description thereof is omitted here.

In a case where the individual impedance of the GND wiring 42 is large relative to the GND wiring 41, in Embodiment 1, the extension pad 71 and the extension pad 72 are electrically connected by a bonding wire 6. In the present embodiment, in addition thereto, the extension pad 74 and the extension pad 75 can be electrically connected by a bonding wire 6. By this means, the individual impedance of the GND wiring 42 of the PLL 22 can be further reduced, and the EMS characteristics can be further improved.

[Connections Between Electrode Pads and Bonding Pads, and Between Extension Pads]

Figure 9A:
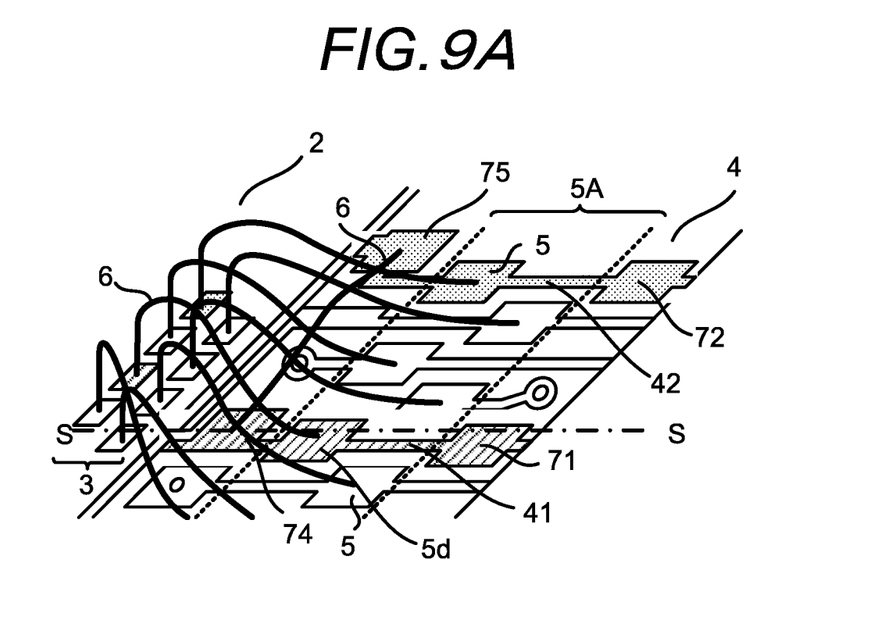
FIG. 9A and FIG. 9B are views for describing connections by bonding wires of Embodiment 2.
Figure 9B:
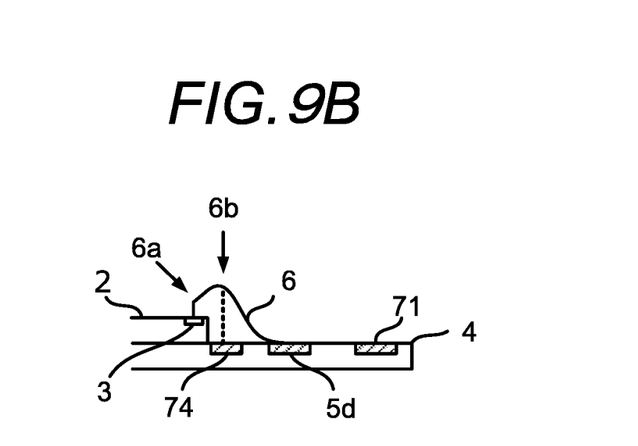

FIG. 9A and FIG. 9B are views for describing one example of the connections between the electrode pads 3 of the semiconductor chip 2 and the bonding pads 5 of the bonding pad area 5A of the wiring substrate 4, and the connection between the extension pad 75 and the extension pad 76 by means of the bonding wires 6. FIG. 9A is a perspective view illustrating the state of the semiconductor chip 2 and the wiring substrate 4 in the vicinity of the GND wiring 41 and the GND wiring 42 illustrated in FIG. 8. In FIG. 9A, the electrode pads 3 of the semiconductor chip 2 and the bonding pads 5 of the bonding pad area 5A of the wiring substrate 4 are connected in a one-to-one manner through the bonding wires 6 indicated by thick solid lines. Further, in FIG. 9A, the extension pad 74 and the extension pad 75 are also connected through a bonding wire 6. The bonding wire 6 that connects the extension pads 74 and 75 does not interfere with the bonding wires 6 that connect the electrode pads 3 of the semiconductor chip 2 and the bonding pads 5 of the bonding pad area 5A of the wiring substrate 4.

FIG. 9B is a view illustrating a cross-section obtained when the semiconductor chip 2 and the wiring substrate 4 are cut along a line S-S' indicated by an alternate long and short dash line in FIG. 9A. The electrode pad 3 is illustrated in the cross-section of the semiconductor chip 2, and the bonding pad 5d that is connected to the GND wiring 41, and the extension pads 71 and 74 are illustrated in the cross-section of the wiring substrate 4. Further, the bonding wire 6 represents a bonding wire that connects the electrode pad 3 of the semiconductor chip 2 and the bonding pad 5d of the wiring substrate 4. The bonding wire 6 that has one end connected to the electrode pad 3 of the semiconductor chip 2 extends in the upward direction in the drawing and is bent in a diagonally upward direction at a position 6a, and then curves in an arc shape to be connected to the corresponding bonding pad 5d. As illustrated in FIG. 9B, the extension pad 74 is provided at a position 6b at which the distance between the bonding wire 6 and the wiring substrate 4 is greatest. The position 6b is a favorable position in order for the bonding wire 6 that connects the extension pads 74 and 75 to avoid interference with the bonding wire 6 that passes through the space above the extension pad 74. Further, with regard to the position at which the extension pad 75 is provided also, the extension pad 75 is provided at a position at which the distance between the bonding wire 6 that passes through the space above the extension pad 75 and the wiring substrate 4 is greatest.

In the present embodiment, extension pads capable of connecting different GND wirings through a bonding wire 6 are provided not only on the peripheral portion edge side of the wiring substrate 4, but also between the semiconductor chip 2 and the bonding pad areas. By this means, since a selection can be made regarding whether to connect with one of the extension pads or to connect with both extension pads, finer adjustment of individual impedance and common impedance can be performed. Note that, although in the present embodiment, a case is described in which the extension pads 74 and 75 are provided in addition to the extension pads 71 and 72, a configuration may also be adopted in which only the extension pads 74 and 75 are provided instead of the extension pads 71 and 72.

Other Example

Figure 10:
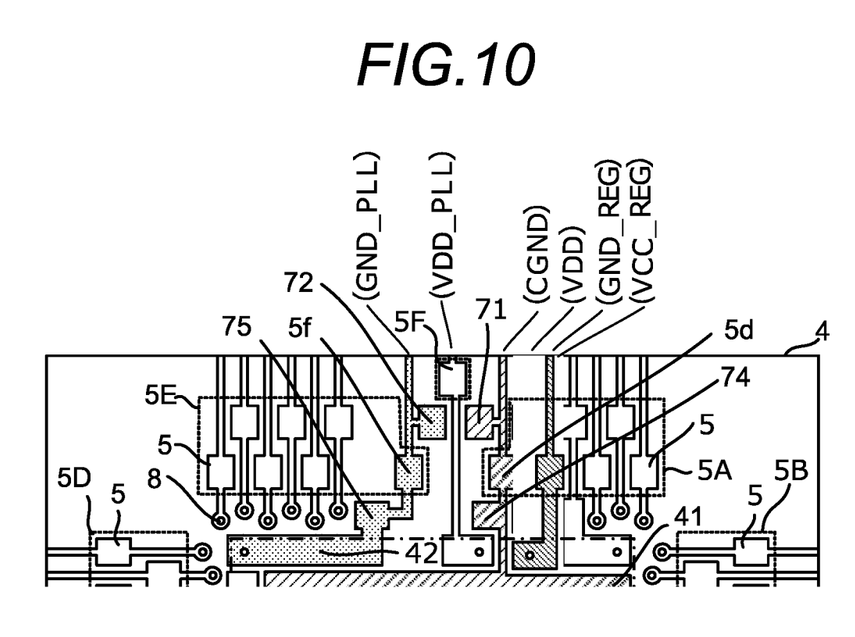
FIG. 10 is an outer layer wiring pattern diagram illustrating a wiring pattern of the wiring substrate of Embodiment 2.

FIG. 10 is a view for describing an example in which the extension pads 74 and 75 are added to FIG. 6 of Embodiment 1. In FIG. 10, the extension pads 74 and 75 are provided between the bonding pad areas 5A and 5E and the semiconductor chip 2, respectively. Note that, in order to provide the extension pad 75, the positions of vias of two wiring patterns on the left side of the GND wiring 42 in the drawing are changed from positions between the bonding pad area 5E and the semiconductor chip 2 (FIG. 6) to positions between the bonding pad area 5E and the peripheral portion edge side of the wiring substrate 4. Further, in FIG. 10, the extension pad 71 is provided at a position facing the extension pad 72. Therefore, the bonding pad of the power supply wiring VDD_PLL is provided in a bonding pad area 5F that is located at a position which is between the bonding pad areas 5A and 5E and the peripheral portion of the wiring substrate 4 and which is also between the bonding pad area 5A and the bonding pad area 5E. Therefore, in the example illustrated in FIG. 10, the bonding pad area 5A illustrated in FIG. 6 is divided into the three bonding pad areas 5A, 5E and 5F, and the extension pads 71 and 72 are provided at positions surrounded by the bonding pad areas 5A, 5E and 5F.

In a case where the individual impedance of the GND wiring 42 is large relative to the GND wiring 41, in FIG. 10, in addition to the extension pad 71 and the extension pad 72, the extension pad 74 and the extension pad 75 can be electrically connected through a bonding wire 6. By this means, the individual impedance of the GND wiring 42 of the PLL 22 can be further reduced and the EMS characteristics can be further improved.

As described above, according to the present embodiment, adjustment of impedance of a wiring substrate can be performed using an inexpensive configuration.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-166638, filed Sep. 12, 2019, which is hereby incorporated by reference herein in its entirety.

What is claimed is:

1. A circuit board on which a semiconductor chip is mounted, the semiconductor chip having a plurality of circuits and a plurality of electrode pads connected to the plurality of circuits, the circuit board including a plurality of wiring-patterns having a plurality of bonding pads, the plurality of bonding pads electrically connected through wires with the plurality of electrode pads, the plurality of bonding pads including a first bonding pad and a second bonding pad configured to supply a ground potential,
wherein the plurality of the wiring patterns comprises:
a first ground wiring pattern including the first bonding pad and a first extension pad; and
a second ground wiring pattern including the second bonding pad and a second extension pad,
wherein the first ground wiring pattern and the second ground wiring pattern are separated on the circuit board,
wherein the first extension pad and the second extension pad are not directly connected to the plurality of electrode pads through any wire, and on the circuit board, the first extension pad and second extension pad are positioned without any bonding pad between the first extension pad and second extension pad, and
the first extension pad and the second extension pad being provided in a different area from an area in which the plurality of bonding pads is provided,
wherein a difference between an individual impedance of the second ground wiring pattern and an individual impedance of the first ground wiring pattern in a case where the first extension pad and the second extension pad are connected is smaller than a difference between an individual impedance of the second ground wiring pattern and an individual impedance of the first ground wiring pattern in a case where the first extension pad and the second extension pad are not connected.

2. A circuit board according to claim 1, wherein the first extension pad and the second extension pad are provided in an area such that a wire that connects the first extension pad and the second extension pad does not interfere with wires that connect the plurality of electrode pads and the plurality of bonding pads.

3. A circuit board according to claim 2, wherein the first extension pad and the second extension pad are provided in an area between the area in which the plurality of bonding pads is provided and an outer peripheral portion of the circuit board.

4. A circuit board according to claim 3, wherein the area in which the plurality of bonding pads is provided has a depressed area on an outer peripheral portion side of the circuit board, the depressed area having a depressed shape in which the plurality of bonding pads is not provided, and
wherein the first extension pad and the second extension pad are provided in the area with the depressed shape.

5. A circuit board according to claim 2, wherein the first extension pad and the second extension pad are provided in an area between the area in which the plurality of bonding pads is provided and an outer peripheral portion of the semiconductor chip.

6. A circuit board according to claim 5, wherein in a case where the first extension pad and the second extension pad are provided in an area between the area in which the plurality of bonding pads is provided and the outer peripheral portion of the semiconductor chip, the first extension pad and the second extension pad are provided at positions at which heights of wires from the circuit board, connecting the plurality of electrode pads and the plurality of bonding pads, are highest.

7. A circuit board according to claim 2, wherein the first extension pad and the second extension pad are provided in an area between the area in which the plurality of bonding pads is provided and an outer peripheral portion of the circuit board, and third and fourth extension pads, respectively connected to the first and second extension pads, are provided in an area between the area in which the plurality of bonding pads is provided and an outer peripheral portion of the semiconductor chip.

8. A circuit board according to claim 7, wherein the third extension pad and the fourth extension pad are provided are positions at which heights of wires from the circuit board, connecting the plurality of electrode pads and the plurality of bonding pads, are highest.

9. A circuit board according to claim 2,
wherein areas in which the plurality of bonding pads is provided are respectively divided into a plurality of divided areas in which the plurality of bonding pads is provided, and
wherein the first extension pad and the second extension pad are provided between the divided areas.

10. A circuit board according to claim 9, wherein the first bonding pad is connected to an electrode pad among the electrode pads, the electrode pad provided for supplying a common ground potential to a predetermined circuit not included in the plurality of circuits of the semiconductor chip.

11. A circuit board according to claim 1, wherein the second bonding pad is connected to the electrode pads provided in each of the plurality of circuits of the semiconductor chip.

12. A semiconductor apparatus comprising a circuit board on which a semiconductor chip is mounted, the semiconductor chip having a plurality of circuits and a plurality of electrode pads connected to the plurality of circuits, the circuit board including a plurality of wiring patterns having a plurality of bonding pads, the plurality of bonding pads electrically connected through wires with the plurality of electrode pads, wherein the plurality of bonding pads including a first bonding pad and a second bonding pad configured to supply a ground potential,
wherein the plurality of the wiring patterns comprises:
a first ground wiring pattern including the first bonding pad and a first extension pad; and
a second ground wiring pattern including the second bonding pad and a second extension pad, wherein the first ground wiring pattern and the second ground wiring pattern are separated on the circuit board, wherein the first extension pad and the second extension pad are not directly connected to the plurality of electrode pads through any wire, and on the circuit board, the first extension pad and second extension pad are positioned without any bonding pad between the first extension pad and second extension pad, the first extension pad and the second extension pad provided in a different area from an area in which the plurality of bonding pads is provided, wherein the semiconductor apparatus further comprises ball electrodes on a surface of the circuit board which is opposite to a surface on which the semiconductor chip is mounted, the ball electrodes electrically connected to the plurality of the bonding pads, and wherein the circuit board and the semiconductor chip mounted on the circuit board are sealed by a seal member, wherein a difference between an individual impedance of the second ground wiring pattern and an individual impedance of the first ground wiring pattern in a case where the first extension pad and the second extension pad are connected is smaller than a difference between an individual impedance of the second ground wiring pattern and an individual impedance of the first ground wiring pattern in a case where the first extension pad and the second extension pad are not connected.

13. A semiconductor apparatus according to claim 12, wherein the first extension pad and the second extension pad are provided in an area such that a wire that connects the first extension pad and the second extension pad does not interfere with wires that connect the plurality of electrode pads and the plurality of bonding pads.

14. A semiconductor apparatus according to claim 13, wherein the first extension pad and the second extension pad are provided in an area between the area in which the plurality of bonding pads is provided and an outer peripheral portion of the circuit board.

15. A semiconductor apparatus according to claim 14, wherein the area in which the plurality of bonding pads is provided has a depressed area on an outer peripheral portion side of the circuit board, the depressed area having a depressed shape in which the plurality of bonding pads is not provided, and wherein the first extension pad and the second extension pad are provided in the area with the depressed shape.

16. A semiconductor apparatus according to claim 13, wherein the first extension pad and the second extension pad are provided in an area between the area in which the plurality of bonding pads is provided and an outer peripheral portion of the semiconductor chip.

17. A semiconductor apparatus according to claim 16, wherein in a case where the first extension pad and the second extension pad are provided in an area between the area in which the plurality of bonding pads is provided and the outer peripheral portion of the semiconductor chip, the first extension pad and the second extension pad are provided at positions at which heights of wires from the circuit board are highest, the wires connecting the plurality of electrode pads and the plurality of bonding pads.

18. A semiconductor apparatus according to claim 13, wherein the first extension pad and the second extension pad are provided in an area between the area in which the plurality of bonding pads is provided and an outer peripheral portion of the circuit board, and in an area between the area in which the plurality of bonding pads is provided and an outer peripheral portion of the semiconductor chip.

* * * * *